(12) United States Patent
Tran et al.

(10) Patent No.: US 7,508,239 B2
(45) Date of Patent: Mar. 24, 2009

(54) PATTERN SEQUENCE AND STATE TRANSITION TRIGGERS

(75) Inventors: Que Thuy Tran, Beaverton, OR (US);
David L. Kelly, Portland, OR (US);
Michael M. Heidling, Durham, OR (US)

(73) Assignee: Tektronix, Inc, Beaverton, OR (US)

( * ) Notice: Subject to any disclaimer, the term of this patent is extended or adjusted under 35 U.S.C. 154(b) by 765 days.

(21) Appl. No.: 11/202,595

(22) Filed: Aug. 11, 2005

(65) Prior Publication Data

US 2007/0038892 A1    Feb. 15, 2007

(51) Int. Cl.
*H03D 13/00* (2006.01)
(52) U.S. Cl. .......................... 327/12; 327/199; 327/298
(58) Field of Classification Search .................. 327/12, 327/142, 144, 198, 199, 200, 293, 294, 298, 327/299
See application file for complete search history.

(56) References Cited

U.S. PATENT DOCUMENTS 6,882,570 B2 *    4/2005    Byeon et al. ........... 365/185.18
6,943,595 B2 *    9/2005    Sugimoto et al. ........... 327/141

* cited by examiner

*Primary Examiner*—An T Luu
(74) *Attorney, Agent, or Firm*—Francis I. Gray; Thomas F. Lenihan

(57) ABSTRACT

A pattern sequence and state transition trigger generator provides a trigger when a specified transition from one pattern/state to another pattern/state occurs in a set of input signals. Decoders detect each specified pattern/state from the set of input signals to produce a prior value and a current value representing the transition. The prior value is slightly delayed and combined with the current value to produce an overlap when the specified transition occurs, which in turn generates the trigger.

15 Claims, 6 Drawing Sheets

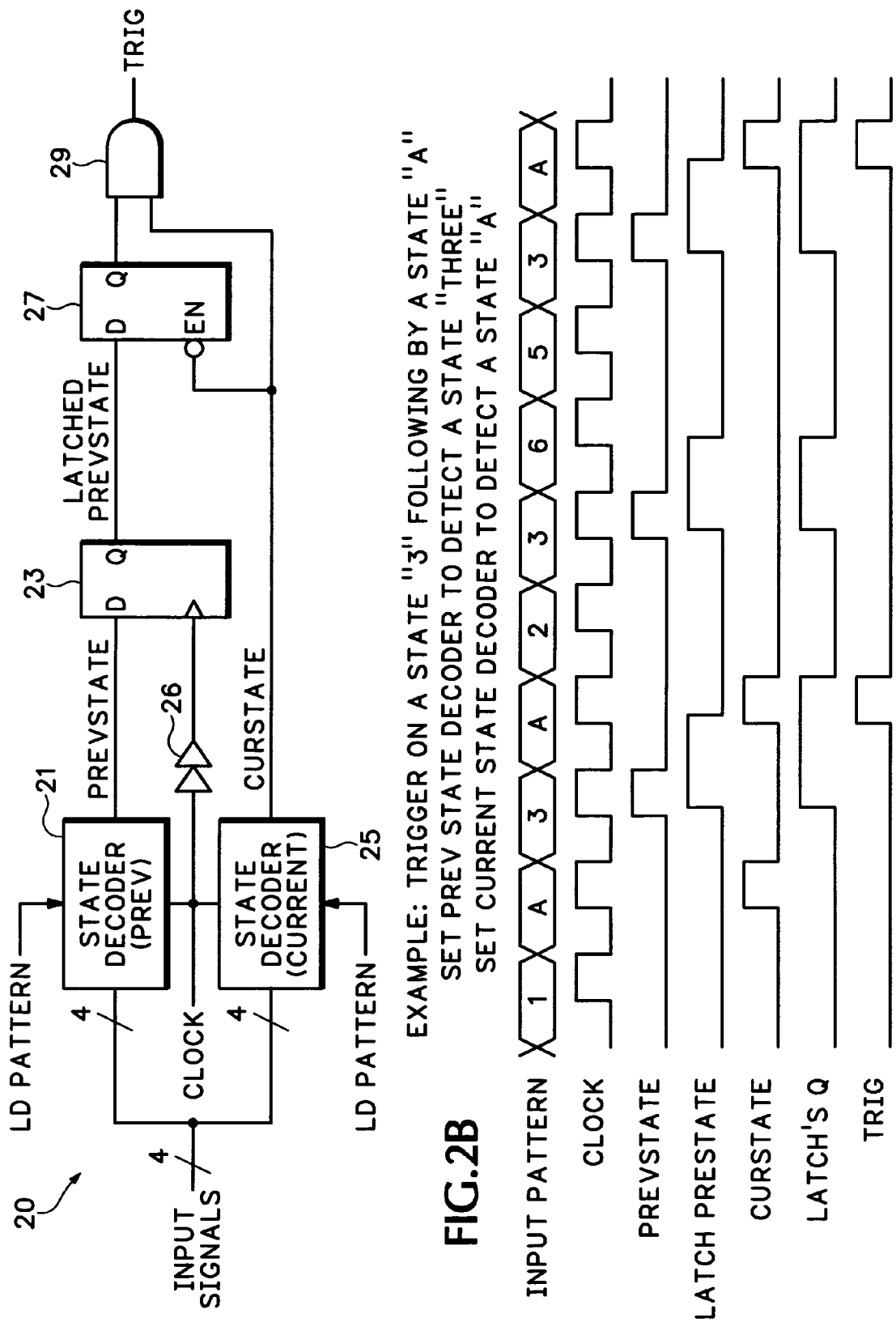

PATTERN SEQUENCE AND STATE TRANSITION TRIGGERS

BACKGROUND OF THE INVENTION

The present invention relates to signal acquisition, and more particularly to pattern sequence and state transition triggers to enable acquisition triggering when a set of channels change from one state of interest to another.

For some time signal acquisition devices, such as oscilloscopes that acquire and display electrical signals, have allowed users to abstract Boolean logic from signals applied to input channels of the devices. For example a Boolean value may be assigned to the electrical signals of a two-channel oscilloscope that varies between 00 and 11 in binary—a four-channel oscilloscope varies between Boolean values of 0000 and 1111. In the four-channel illustration this implies that at any given instant in time the four channels may have one of sixteen different Boolean values. The transition to the next Boolean value is one of 256 possibilities. Currently acquisition devices do not have a means for triggering on specific state transitions, i.e., they are not programmable to trigger if, and only if, the prior state is "11" and the new state is "01."

What is desired is the ability to identify and trigger on a transition from one specific Boolean state to another specific Boolean state.

BRIEF SUMMARY OF THE INVENTION

Accordingly the present invention provides a pattern-sequence/state-transition trigger for acquiring data from electrical signals when a plurality of signals transition from one specified Boolean state to another specified Boolean state. A pattern/state transition trigger generator provides the trigger when the specified transition from one pattern/state to another pattern/state occurs in the plurality of input signals. Decoders detect each specified pattern/state from the plurality of input signals to produce a prior value and a current value representing the transition. The prior value is slightly delayed and combined with the current value to produce an overlap when the specified transition occurs, which in turn generates the trigger.

The objects, advantages and other novel features of the present invention are apparent from the following detailed description when read in conjunction with the appended claims and attached drawing.

DETAILED DESCRIPTION OF THE INVENTION

Figure 1:
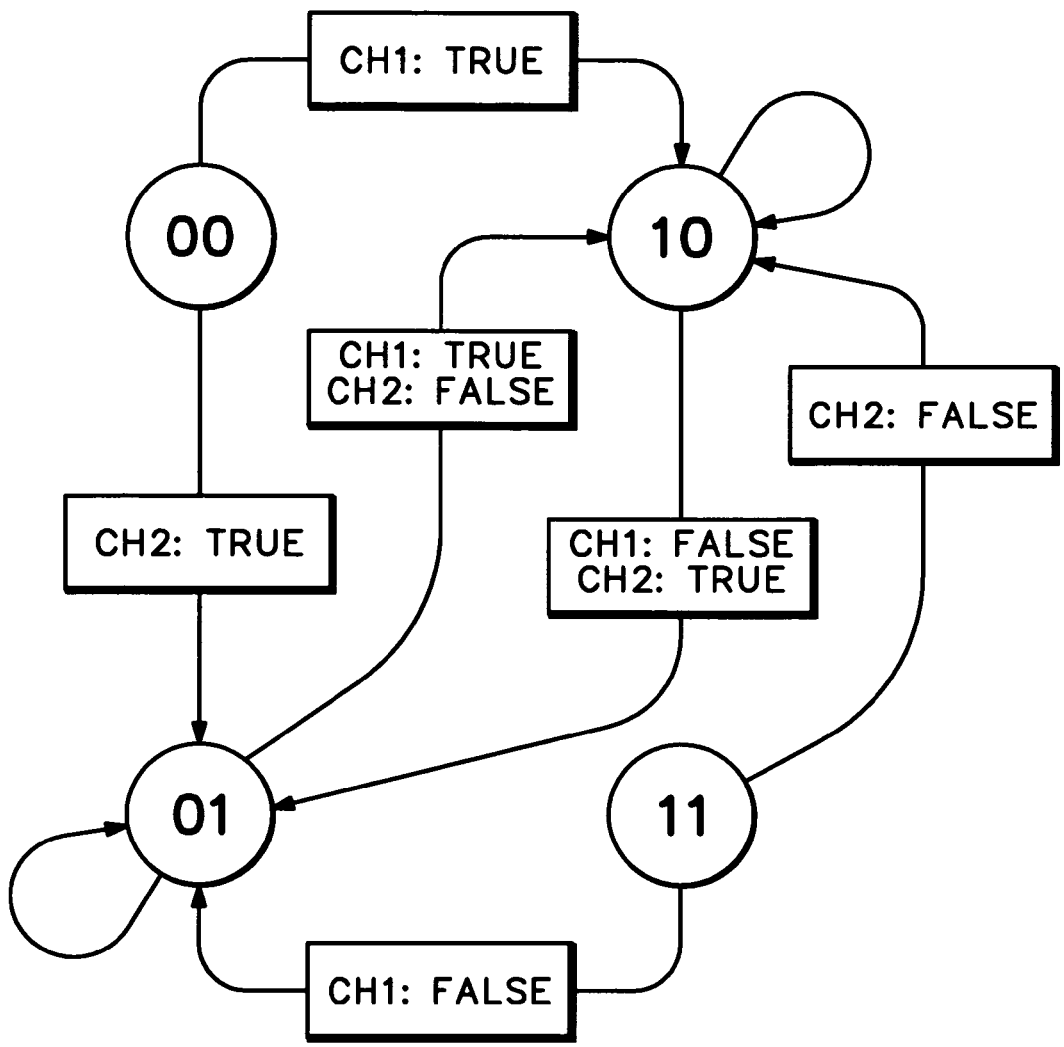
FIG. 1 is a flow diagram view of a two-channel finite state machine according to the present invention.

Referring now to FIG. 1 an illustration of a finite state machine for a two-channel input device is shown. The finite state machine shows the logical states formed by two electrical signals and the transitions from prior states that may be detected. For descriptive purposes the terms "High", "True", "Above" and "1" are synonymous in meaning, as are the terms "Low", "False", "Below" and "0." A logic value of "1" maybe be assigned to a channel when the voltage of the electrical signal is above a High designated threshold, and a logic value of "0" may be assigned when the voltage of the electrical signal is below a Low designated threshold. The High and Low designated thresholds may be the same, i.e., a single threshold may be used to differentiate between "1"s and "0"s. Each state in the finite state machine has a two-digit name where arbitrarily assigned Channel 1's logic value is the left-most digit and Channel 2's logic value is the right-most digit. Therefore "01" is a Boolean value indicative of Channel 1 being Below and Channel 2 being Above the respective thresholds.

The finite state machine shown in FIG. 1 is an Exclusive-OR finite state machine. As an example suppose that one wants to generate a trigger for signal acquisition only for state transitions that occur from 11 to 01—transitions from both channel inputs being high to Channel one input being Low and Channel two remaining High. In this situation the request is to identify a logical change in the electrical relationship between the signals on the respective Channel inputs. By focusing on a single transition of interest it is possible to determine that the transition either never occurs or occurs as expected. By extension a set of decoders may be built that recognize all eight of the transitions in an exclusive-OR state machine of two channels. In the general case one may extend the concept to create hardware that is programmable so the user may program the decoders to recognize and trigger on any of N transitions for a state machine of M states with Q channels.

Figure 2A:
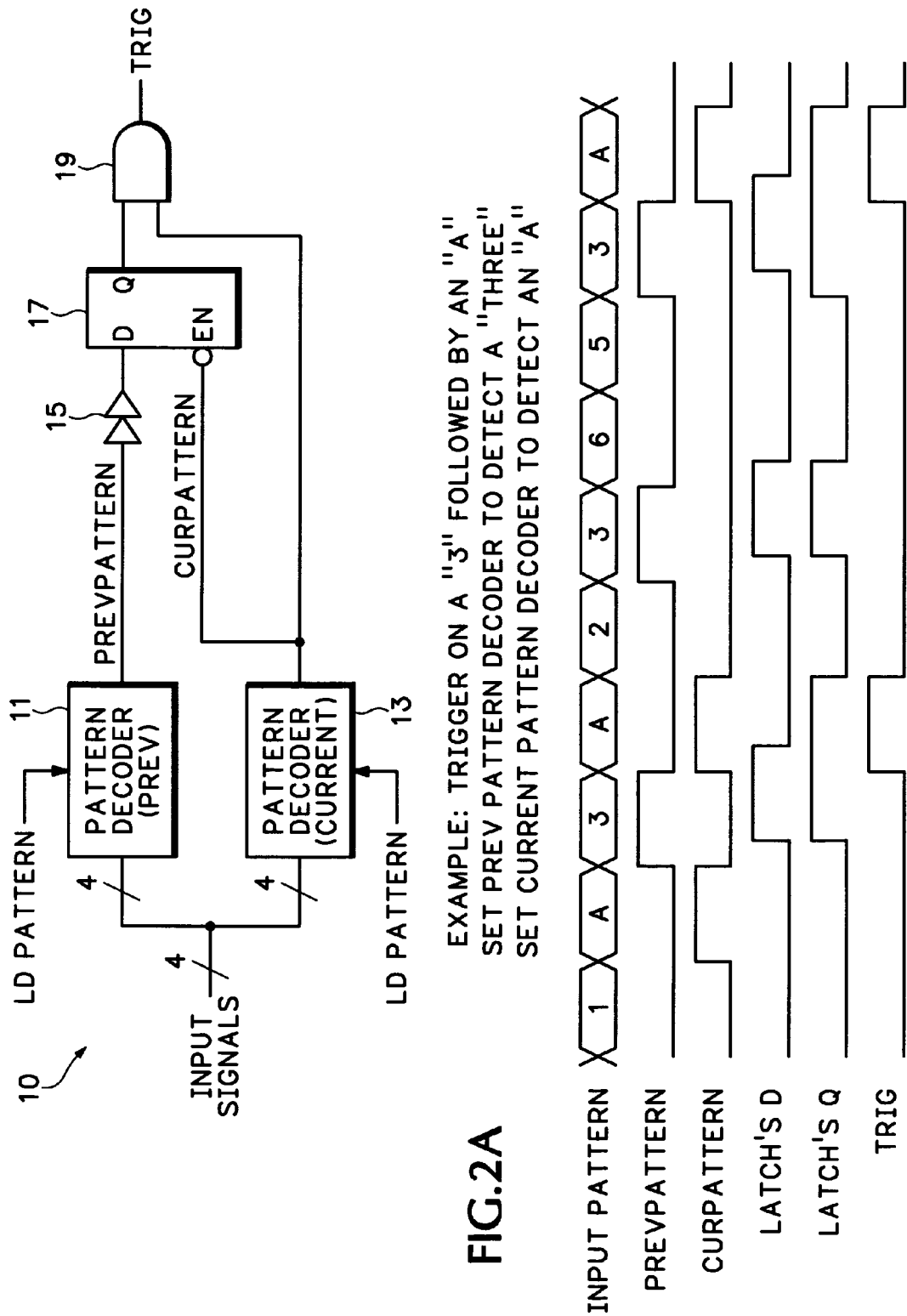
FIG. 2 is a block diagram view of (A) a pattern sequence trigger (unclocked) circuit and (B) a state transition trigger (clocked) circuit according to the present invention.

FIG. 2 shows hardware for a pattern sequence trigger 10 (FIG. 2A) and a state transition trigger 20 (FIG. 2B). The pattern sequence trigger recognizes a change in state without the benefit of a clock, while the state transition trigger recognizes a valid state change with a designated edge of a clock so that, if the rising edge is designated, as each rising edge of the clock occurs the state transition trigger latches the decoded signals and, when they match, enables a trigger.

For the pattern sequence trigger 10 a prior pattern decoder 11 is set to a first desired value (LD PATTERN), such as a "3", and a current pattern decoder 13 is set to a second desired value (LD PATTERN), such as "A." In this illustration a four-channel input signal is applied to both pattern decoders 11, 13 for comparison with the respective loaded desired values. When one of the patterns is recognized, the appropriate decoder 11, 13 provides a pattern output signal. The prior pattern from the prior pattern decoder 11 is delayed slightly by a delay device 15 and input to a D-input of a latch 17. The current pattern from the current pattern decoder 13 is applied to a /Enable input of the latch 17 and to an AND gate 19. A Q-output from the latch 17 also is input to the AND gate 19. In operation, as shown in the related waveforms, an input pattern has a series of states. When the pattern "3" is detected the output from the prior pattern decoder 11 goes High for the duration of the pattern and is delayed slightly prior to input to the D-input of the latch 17. Since the output from the current pattern decoder 13 is Low, the High value is transferred to the Q-output of the latch 17. When the current pattern follows immediately after the prior pattern there is an overlap between the High Q-output of the latch 17 and the High value for the current pattern, which results in the AND gate 19 generating the trigger signal. At the conclusion of the current pattern the latch 17 is caused to latch in a Low value from the delayed prior pattern so that, even if the prior value follows immediately after the current value, the output of the latch goes Low.

For the state transition trigger 20 a prior state decoder 21 detects a prior state from the four-channel input signal, such as "3" in this example, when a clock pulse occurs, which prior state is input to the D-input of a first latch 23. Likewise a current state decoder 25 detects a current state from the four-channel input signal, such as "A" in this example, when the clock pulse occurs. The clock is delayed slightly by a delay device 26 before being applied to the clock input of the first latch 23 to latch the prior state to the 0-output of the first latch. The Q-output of the first latch 23 is coupled to the D-input of a second latch 27, the prior state from the first latch being delayed slightly due to the clock delay. The current state from the current state decoder 25 is input to a /Enable input of a second latch so that, when current state is Low, the prior state is latched to the Q-output of the second latch 27. The Q-output of the second latch 27 and the current state from the current state decoder 25 are input to an AND gate 29 so that, when the prior state is followed immediately after by the current state, the AND gate outputs a trigger signal. Again the waveforms illustrate the operation of the state transition trigger hardware 20.

These pattern sequence and state transition triggers may be used to identify portions of electrical signals that are of interest in complex trigger setups. If the trigger is generated from the pattern sequence, for example, it may be that the user wants to look at related electrical signals that immediately follow with a different kind of trigger setup. Therefore the signal of interest may be pre-qualified. Likewise other triggers may be used to pre-qualify a signal or set of signals before the pattern sequence trigger is generated, i.e., post-qualifying signals to find the signal that should be acquired. Either pattern sequence or state transition triggers may be used interchangeably to pre-qualify or post-qualify signals to be acquired.

Figure 3:
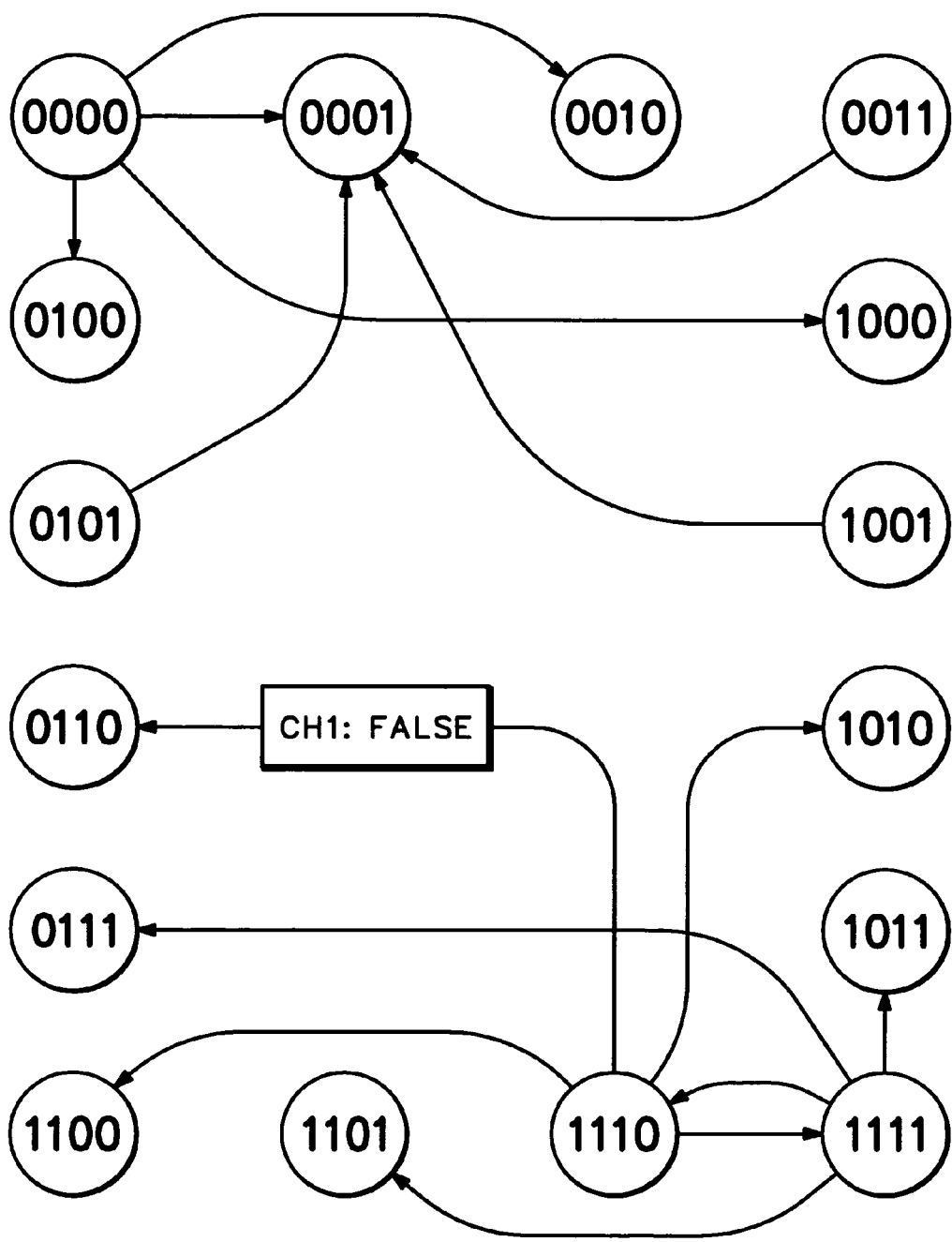
FIG. 3 is a partial flow diagram view of a four-channel finite state machine according to the present invention.

FIG. 3 illustrates a four-channel case where 16 states with 256 transitions may occur between those states, but only 16 of the 256 transitions are pictured. Any one transition may be singled out and triggered on. In this example the transition to identify is state "1110" going to state "0110", i.e., when Channel 1 goes false. The other 255 transitions are rejected and no trigger is generated.

Figure 4:
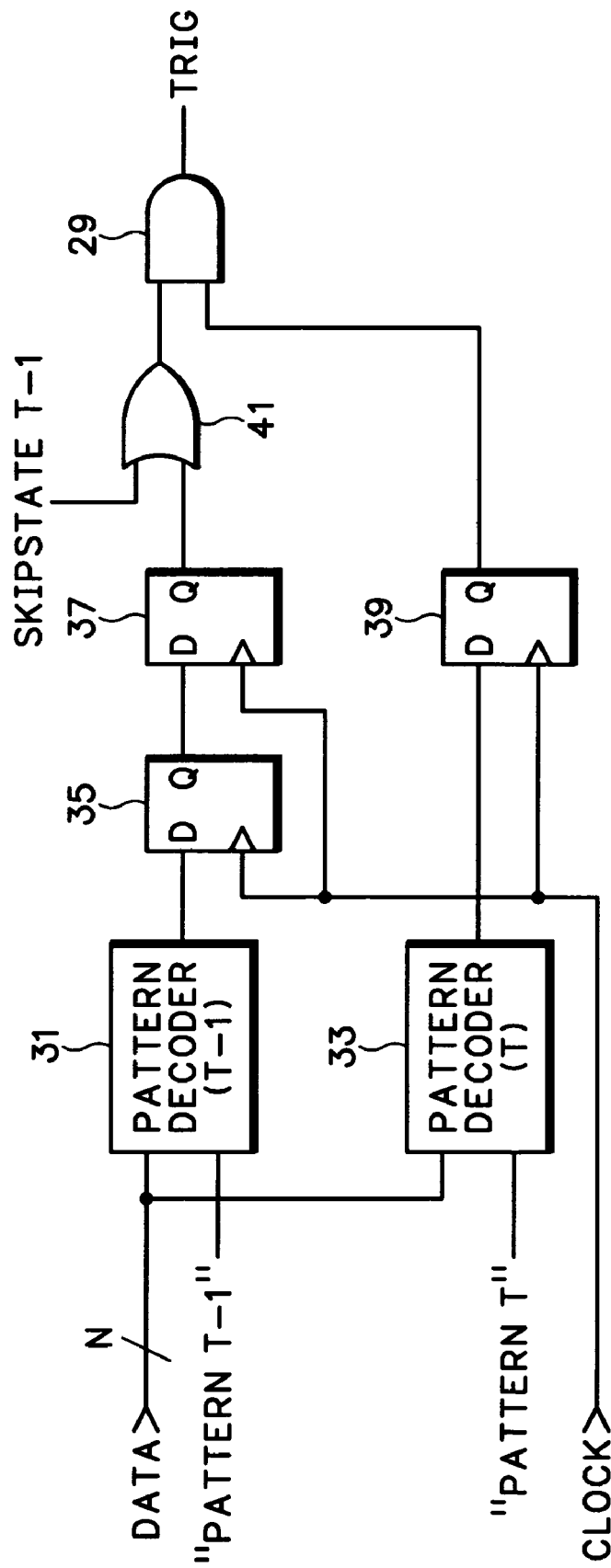
FIG. 4 is a block diagram view of an alternative embodiment for the state transition trigger circuit of FIG. 2B according to the present invention.

In FIG. 4 the data representing a plurality (N) of input signals is input to respective pattern decoders 31, 33 for detecting a transition from a first pattern at time T-1 to a second pattern at time T. The data is compared with the respective loaded patterns, Pattern(T-1) and Pattern(T). A clock signal is applied to respective latches 35, 37, 39 to clock level at a D-input to a Q-output. The first latch 35 has the prior pattern (T-1) from the first pattern decoder 31 as an input and acts as a one clock cycle delay device. The prior pattern at the output of the first latch 35 is applied to the second latch 37 at the same time as the current pattern (T) from the second decoder 33 is applied to the third latch 39. If the current pattern follows immediately after the prior pattern, then the output of the second and third latches 37, 39 are clocked High at the same time by the clock signal and applied to the trigger AND gate 29 to produce the trigger signal for the specified state transition. An optional OR gate 41 may be inserted into one (or both) of the inputs to the AND gate so that a skipState command may be used to disable that output so that the trigger signal occurs every time one of the patterns is detected.

Figure 5:
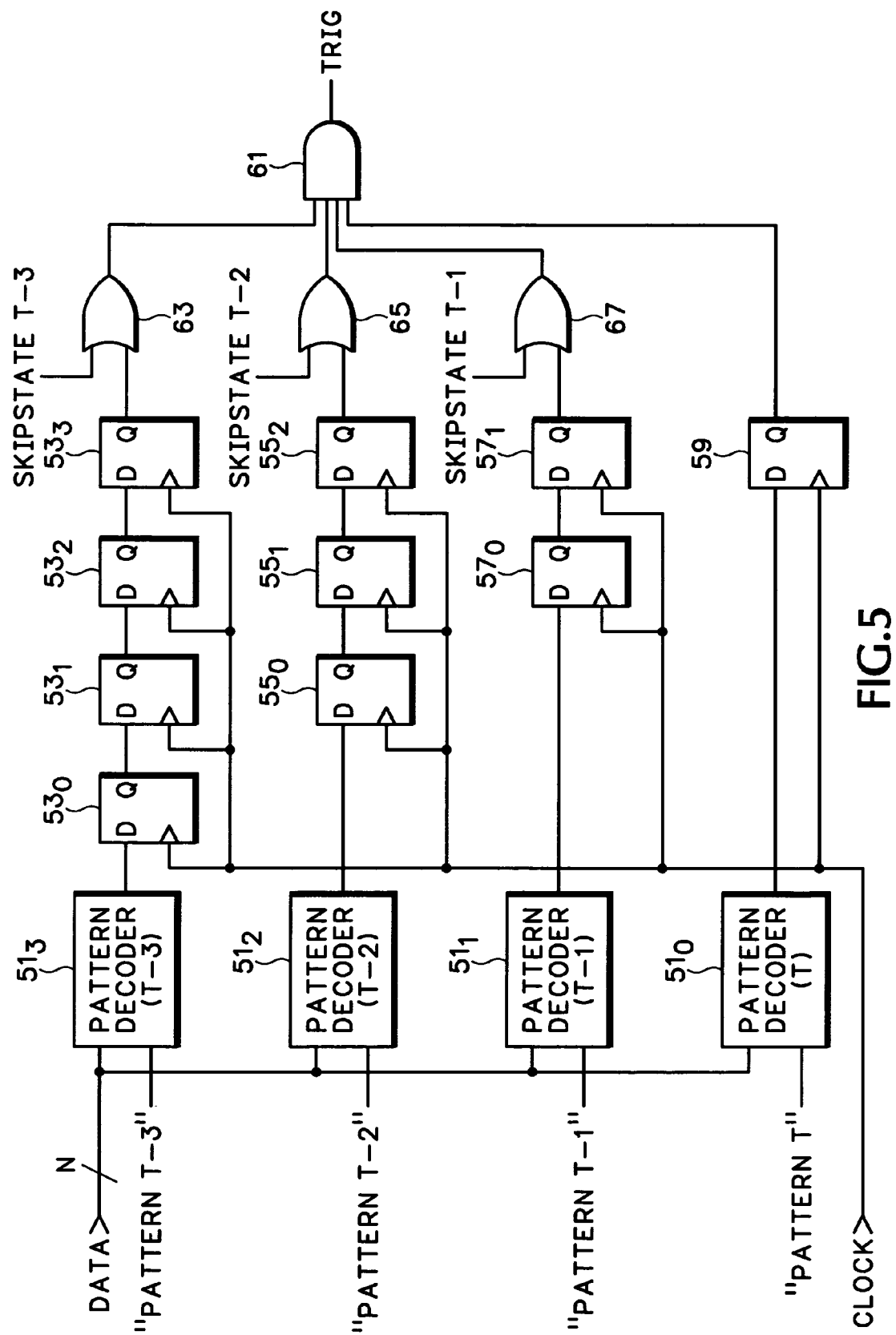
FIG. 5 is a block diagram view of a programmable state transition trigger circuit having multiple states according to the present invention.

In a more detailed state transition trigger circuit 50, as shown in FIG. 5, a more complex sequence of transitions may be detected before the trigger signal is generated. Respective pattern decoders $51_n$ may be loaded with different patterns T through T-n, where n=3 in this example. In this particular embodiment in order for the trigger to be generated the pattern T-3 needs to be followed in sequence by the patterns T-2, then T-1 and finally T. Pattern T-3 is clocked through a series of latches $53_n$, the pattern T-2 is clocked through a series of latches $55_{n-1}$, the pattern T-1 is clocked through a series of latches $57_{n-2}$, and the pattern T is clocked through a latch 59. If the pattern sequence is met, then the outputs of the last latches $53_3$, $55_2$, $57_1$, 59 in each series are High simultaneously which, when applied to a trigger AND gate 61, produces the trigger signal. The optional OR gates 63, 65, 67 may be used with appropriate skipState commands to program the state transition trigger to occur when the sequence T-2, T-1, T or the sequence T1, T or T alone are desired to produce the trigger signal, or to provide sequences where there may be "Don't Care" states between state transitions, i.e., T-3, XX, XX, T may be the desired state transition where the prior pattern is separated from the current pattern by two clock cycles rather than being immediately after each other.

FIGS. 4 and 5 are just some possible programmable hardware configurations. However any number of possible state transition sequences may be used to generate the trigger signal depending upon the number of pattern decoders, with the concomitant number of latches in each decoder path.

The present invention may be used to determine that specific transitions are not occurring when they are not expected to occur; to isolate specific transitions when they are of interest; to pre-qualify a second trigger of any type downstream; to post-qualify a prior trigger of any type upstream; and to determine that transition do occur when they are expected to occur.

What is claimed is:

1. A method of triggering on a sequence in a set of signals comprising the steps of:
   decoding a prior value from the set of input signals;
   decoding a current value from the set of input signals; and
   generating a trigger only when the current value immediately follows the prior value in the sequence.

2. The method as recited in claim 1 wherein the prior and current values represent a prior and current pattern in the set of input signals respectively.

3. The method as recited in claim 2 wherein the generating step comprises the steps of:
   latching the prior pattern to produce a slightly delayed prior pattern when there is no current pattern from the current pattern decoding step; and
   combining the slightly delayed prior pattern with the current pattern to produce the trigger when the current pattern overlaps the slightly delayed prior pattern from the latching step indicating that the current pattern immediately follows the prior pattern in the sequence.

4. The method as recited in claim 1 wherein the prior and current values represent a prior and current state for the set of input signals respectively.

5. The method as recited in claim 4 wherein the decoding steps comprise providing an output signal for the prior and current states during a clock pulse when the prior and current states are present in the set of signals.

6. The method as recited in claim 5 wherein the generating step comprises the steps of:
   latching the prior state as a slightly delayed prior state in response to the clock pulse;
   latching the slightly delayed prior state when there is no current state; and combining the latched slightly delayed prior state with the current state to produce the trigger when the current state overlaps the slightly delayed prior state from the second latching step indicating that the current state immediately follows the prior state in the sequence.

7. An apparatus for triggering on a sequence in a set of signals comprising:
  means for decoding a prior value from the set of input signals;
  means for decoding a current value from the set of input signals; and
  means for generating a trigger only when the current value immediately follows the prior value in the sequence.

8. The apparatus as recited in claim 7 wherein the prior and current values represent a prior and current pattern in the set of input signals respectively.

9. The apparatus as recited in claim 8 wherein generating means comprises:
  means for latching the prior pattern to produce a slightly delayed prior pattern when there is no current pattern from the current pattern decoding means; and
  means for combining the slightly delayed prior pattern with the current pattern to produce the trigger when the current pattern overlaps the slightly delayed prior pattern from the latching means indicating that the current pattern immediately follows the prior pattern in the sequence.

10. The apparatus as recited in claim 7 wherein the prior and current values represent a prior and current state for the set of input signals respectively.

11. The apparatus as recited in claim 10 wherein the decoding means each comprise means for providing an output signal for the prior and current states during a clock pulse when the prior and current states are present in the set of signals.

12. The apparatus as recited in claim 11 wherein the generating means:
  first means for latching the prior state as a slightly delayed prior state in response to the clock pulse;
  second means for latching the slightly delayed prior state when there is no current state; and
  means for combining the slightly delayed prior state from the second latching means with the current state to produce the trigger when the current state overlaps the slightly delayed prior state indicating that the current state immediately follows the prior state in the sequence.

13. An apparatus for triggering on a sequence in a set of signals comprising:
  a first decoder for decoding from the set of signals a prior value;
  a second decoder for decoding from the set of signals a current value;
  a trigger generator having a delayed version of the prior value and the current value as inputs to produce a trigger when the delayed version of the prior value overlaps the current value indicative of the current value immediately following the prior value in the sequence.

14. The apparatus as recited in claim 13 wherein the trigger generator comprises:
  means for slightly delaying the prior value to produce the delayed version;
  a latch for latching the delayed version to an output when the second decoder does not produce the current value; and
  a logic circuit for combining the delayed version from the latch with the current value from the second decoder to produce the trigger when the current value immediately follows the prior value in the sequence.

15. The apparatus as recited in claim 13 wherein the trigger generator comprises:
  means for slightly delaying a clock signal to produce a delayed clock signal, the clock signal being used in the first and second decoders to generate the prior and current values respectively;
  a first latch for latching the prior value to an output as the delayed version in response to the delayed clock signal;
  a second latch for latching the delayed version to an output when the second decoder does not produce the current value; and
  a logic circuit for combining the delayed version from the second latch with the current value from the second decoder to produce the trigger signal when the delayed version overlaps the current value.

* * * * *